US007850503B2

(12) United States Patent
Nonomura et al.

(10) Patent No.: US 7,850,503 B2
(45) Date of Patent: Dec. 14, 2010

(54) METHOD OF SEALING A PLASMA DISPLAY PANEL BY MEANS OF GLASS FRIT INCORPORATING SPACER BEADS

(75) Inventors: Minahiro Nonomura, Kawasaki (JP); Naoto Yanagihara, Kawasaki (JP); Masayuki Seto, Kawasaki (JP); Yoshitaka Ukai, Kawasaki (JP); Ryouichi Miura, Kawasaki (JP)

(73) Assignee: Fujitsu Hitachi Plasma Display Limited, Kanagawa (JP)

( * ) Notice: Subject to any disclaimer, the term of this patent is extended or adjusted under 35 U.S.C. 154(b) by 312 days.

(21) Appl. No.: 12/222,520

(22) Filed: Aug. 11, 2008

(65) Prior Publication Data

US 2008/0305706 A1 Dec. 11, 2008

Related U.S. Application Data

(62) Division of application No. 11/155,892, filed on Jun. 20, 2005, now abandoned.

(30) Foreign Application Priority Data

Jun. 30, 2004 (JP) ............................ 2004-194227
Dec. 22, 2004 (JP) ............................ 2004-372343

(51) Int. Cl.
*H01J 9/00* (2006.01)
*H01L 51/56* (2006.01)

(52) U.S. Cl. .......................................... 445/25; 445/24

(58) Field of Classification Search .................. 445/24, 445/25; 313/582–587, 292
See application file for complete search history.

(56) References Cited

U.S. PATENT DOCUMENTS 4,001,629 A 1/1977 Thayer ...................... 313/517
6,840,833 B1 * 1/2005 Motowaki et al. ............ 445/25
6,876,150 B2 4/2005 Tanaka
7,119,482 B2 10/2006 Tokioka et al. ............ 313/392

FOREIGN PATENT DOCUMENTS

JP 2001-236896 8/2001
JP 2002348144 A * 12/2002
JP 2003-36794 2/2003
JP 2005314136 A * 11/2005
JP 2006151774 A * 6/2006

OTHER PUBLICATIONS

AE Patent Office Action, dated Oct. 18, 2006, and issued in corresponding Korean Patent Application No. 10-2005-0037372.

* cited by examiner

*Primary Examiner*—Mariceli Santiago
(74) *Attorney, Agent, or Firm*—Staas & Halsey LLP

(57) ABSTRACT

A method for manufacturing a plasma display panel is provided. The method includes making a front substrate and a rear substrate individually and applying a low melting point glass paste including non-porous bead onto a portion of the front substrate or the rear substrate so that the applied low melting point glass paste forms a frame-like shape having a height greater than that of the structural member. The method includes assembling the front substrate and the rear substrate in a face-to-face relation with each other and burning the applied low melting point glass paste while vacuuming a discharge gas space between the front substrate and the rear substrate so as to seal the front substrate and the rear substrate.

7 Claims, 4 Drawing Sheets

METHOD OF SEALING A PLASMA DISPLAY PANEL BY MEANS OF GLASS FRIT INCORPORATING SPACER BEADS

CROSS-REFERENCE TO RELATED APPLICATIONS

This application is a divisional of application Ser. No. 11/155,892 filed Jun. 20, 2005, now abandoned. This application claims the benefit of Japanese Patent Application No. 2004-194227 filed Jun. 20, 2004 and Japanese Patent Application No. 2004-372343 filed Dec. 22, 2004 in the Japanese Patent Office, the disclosures of which are incorporated herein by reference.

BACKGROUND

1. Field

The embodiments discussed herein are directed to a plasma display panel (PDP), and structure of a sealing material that is used for sealing a front substrate and a rear substrate.

2. Description of the Related Art

A plasma display panel includes a front substrate and a rear substrate, which are both larger than a screen. The front substrate and the rear substrate are opposed to each other and sealed with a sealing material that is arranged at the outer portion of the screen and has a frame-like shape so that a closed discharge gas space is defined by them. The front substrate and the rear substrate are glass substrates, while the sealing material is a burned material of low melting point glass.

Among plasma display panels having such a structure, a surface discharge type plasma display panel for use as a color display includes partitions that prevent discharge interference between neighboring cells. The partitions divide the discharge gas space into plural spaces and define a thickness of a portion of the discharge gas space corresponding to the screen. Arrangement patterns of the partitions include a stripe pattern and a mesh pattern. According to the former arrangement pattern, the discharge gas space is divided into plural columns of a matrix display. According to the latter pattern, the discharge gas space is divided into cells of plural columns and plural rows.

In a plasma display panel with partitions, there can be generated a slight curvature of either the front substrate or the rear substrate or the both of them after they are sealed. For example, in a burning process for melting and hardening the sealing material or in a vacuuming process for cleaning the inside prior to filling discharge gas, the pair of glass substrates can be curved by actions of temperature rise of the glass substrates and pressure reduction inside so that the sealing material is compressed. As a result, a thickness of the plasma display panel becomes smaller than a design value at the sealing portion between the front substrate and the rear substrate, while it becomes larger than the design value at the peripheral portion of the screen inside the sealing portion. There can be generated a gap of approximately 10 microns between the partition and the surface of the substrate that are to contact each other inside the portion where the thickness of the plasma display panel becomes larger than the design value. A region with such malcontact may appear in a frame shape along the edge of the screen with a width of approximately a few centimeters. Hereinafter, the decrease of the thickness of the plasma display panel at the sealing portion is referred to as “subsidence”.

The malcontact between the front substrate and the rear substrate inside the sealing portion may cause an abnormal noise during a display operation. When a high frequency drive voltage is applied for a display, periodical electrostatic attraction may vibrate the glass substrates locally, so that a low level of noise at an audible frequency is generated. This noise may deteriorate quality of display operation.

Regarding a method of preventing the curvature of the front substrate and the rear substrate, Japanese unexamined patent publication No. 2001-236896 discloses a sealing material that includes glass beads as spacers. The spacers have substantially the same size of diameter as a height of the partition, so that the gap between the front substrate and the rear substrate at the sealing portion can be maintained at a desired value.

It is necessary that the sealing material includes a sufficient quantity of spacers between the front substrate and the rear substrate along the entire perimeter of the sealing portion in order to make the thickness of the plasma display panel uniform. If a quantity of the spacers is insufficient, the spacers may be broken by an excessive pressure per spacer.

However, if a quantity of glass beads contained as the spacers in the sealing material is increased, viscosity of glass paste that is the sealing material before being burned increases. As a result, productivity in applying the glass paste may be lowered, and height as well as width of a layer of the applied paste tends to be nonuniform. In particular, if glass beads having a broad distribution of granularity are used, viscosity of the glass paste may increase largely.

It may be desirable to use glass beads having uniform grain size without smaller grains that do not work as spacers in order to prevent the increase in viscosity. However, a classification work for obtaining glass beads of a sharp distribution of granularity causes increase of cost of the glass beads. It may be difficult to remove smaller particles compared with removal of larger particles than a desired size.

SUMMARY

An aspect of the present invention is to obtain a uniform thickness of a plasma display panel along the entire perimeter of a sealing portion between the front substrate and the rear substrate by adding an appropriate quantity of spacers into a sealing material for sealing the front substrate and the rear substrate.

According to an exemplary embodiment, a sealing material including non-porous bead spacers is used for sealing the front substrate and the rear substrate that are opposed to each other defining a discharge gas space. A “non-porous bead” in an exemplary embodiment means a bead having a small value of specific surface area such that the viscosity of the sealing paste to be the sealing material is not altered substantially when the beads are added into the sealing material.

According to an exemplary embodiment, the thickness of the plasma display panel can be made uniform along the entire perimeter of the sealing portion between the front substrate and the rear substrate, so that an appropriate contact between the front substrate and the rear substrate can be obtained along the entire perimeter inside the sealing portion. Thus, generation of a noise due to the malcontact can be prevented.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE EMBODIMENTS

Hereinafter, the present invention will be explained more in detail with reference to exemplary embodiments and drawings.

Figure 1:
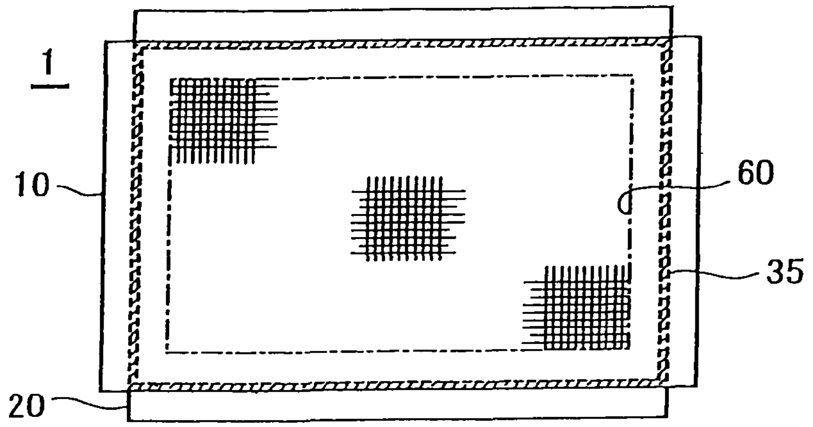
FIG. 1 illustrates a general structure of a plasma display panel.

FIG. 1 illustrates a general structure of a plasma display panel. The plasma display panel 1 includes a front substrate 10 and a rear substrate 20, which constitutes a screen 60 made of plural discharge cells arranged in a matrix. Each of the front substrate 10 and the rear substrate 20 has a structural body including a glass substrate that is larger than the screen 60 and has a thickness of approximately 3 millimeters, on which electrodes and other elements are arranged. The front substrate 10 and the rear substrate 20 are overlapped so as to be opposed to each other and are sealed at their peripheral portions surrounding their overlapped portions by using a sealing material 35 that has a frame-like shape in a plan view. As shown in FIG. 1, the front substrate 10 extends from right and left sides of the rear substrate 20 by approximately 5 millimeters, while the rear substrate 20 extends from upper and lower sides of the front substrate 10 by approximately 5 millimeters. These extending ends of the front substrate 10 and the rear substrate 20 are connected to flexible printed circuit boards, which are connected to a drive unit electrically. For example, if a size of the screen 60 is 41 inches diagonally, the plasma display panel 1 has dimensions of approximately 994×585 millimeters.

Figure 2:
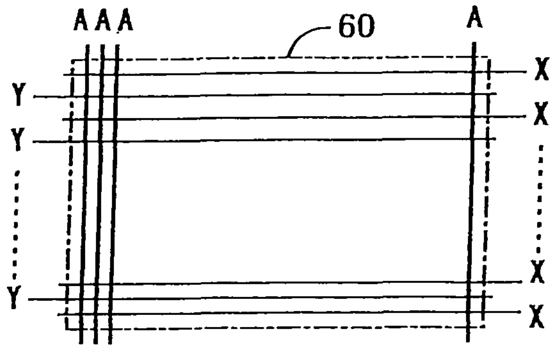
FIG. 2 is a schematic diagram of an electrode matrix.

FIG. 2 is a schematic diagram of an electrode matrix. There are disposed display electrodes X and Y arranged in parallel on the screen 60 for generating display discharge, and address electrodes A are arranged so as to cross the display electrodes X and Y. The display electrodes X and the display electrodes Y are arranged alternately in the order like X, Y, X, Y, . . . , X, Y and X and neighboring display electrodes X and Y constitute a pair of electrodes. Each of the display electrodes X and Y has a lamination structure of a transparent conductive film and a metal film that is a bus conductor.

Figure 3:
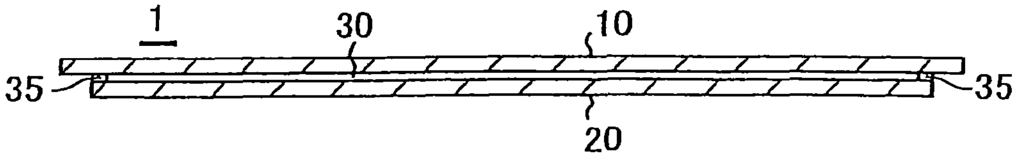
FIG. 3 illustrates a cross sectional structure of the plasma display panel.

FIG. 3 illustrates a cross sectional structure of the plasma display panel. The front substrate 10, the rear substrate 20 and the sealing material 35 define a sealed inner space 30, which is filled with discharge gas that is a mixture of neon and xenon.

Figure 4:
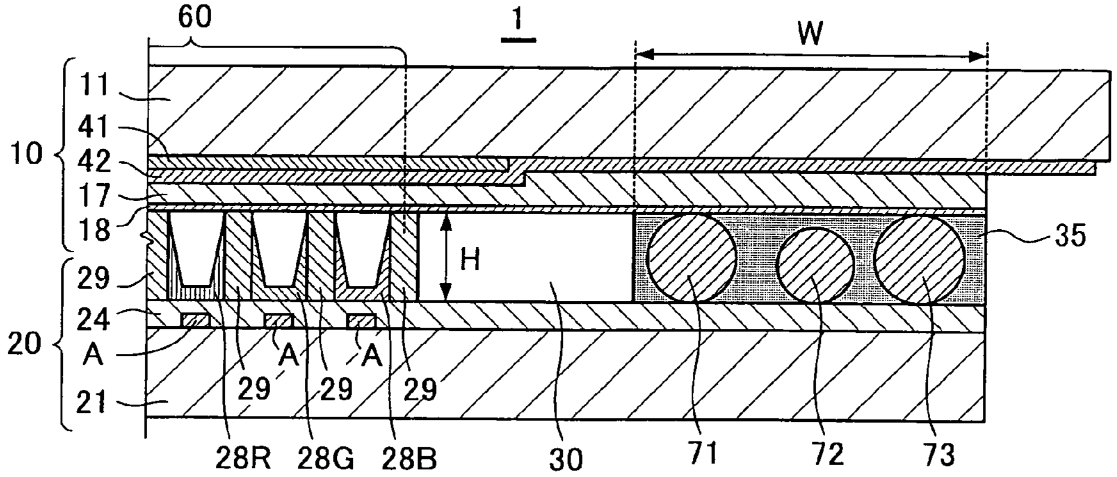
FIG. 4 illustrates a cross sectional structure of the plasma display panel at its peripheral portion with elements of a front substrate and a rear substrate.

FIG. 4 illustrates a cross sectional structure of the plasma display panel at its peripheral portion with elements of the front substrate and the rear substrate. For easy understanding, elements between the glass substrates are drawn with their thickness enlarged in FIG. 4.

The front substrate 10 includes a glass substrate 11, a transparent conductive film 41 and a metal film 42 that are patterned to constitute display electrodes, a dielectric layer 17 on which wall charge is accumulated, and a protection film 18 made of magnesia. The metal film 42 is led to the outside of the sealing material 35.

The rear substrate 20 includes a glass substrate 21, address electrodes A that are column electrodes, a low melting point glass layer 24, a plurality of partitions 29 that are structural members according to an exemplary embodiment, and fluorescent material layers 28R, 28G and 28B for a color display. The exemplified partitions 29 are arranged in a stripe pattern.

Each of the partitions 29 has a function of preventing discharge interference between neighboring columns as well as a function as a spacer. Namely, height (or depth) of the inner space 30 in the screen 60 is defined by the partitions 29, and it is substantially the same as the height H of the partitions 29. The height H may be optimized in accordance with a cell size, and set to a value within the range of 130-200 microns as a typical value.

A distinctive element of the plasma display panel 1 is the sealing material 35 for unifying the front substrate 10 and the rear substrate 20. The sealing material 35 may be a burned material of low melting point glass paste, which includes a sufficient quantity of bead spacers 71, 72, 73 . . . for preventing subsidence of the plasma display panel 1 and for equalizing thickness at the peripheral portion. The sealing material 35 may have a width W within a range of approximately 8-12 millimeters. A distance between the inner end of the sealing material 35 and the partition 29 may be approximately 20 millimeters.

Figure 5:
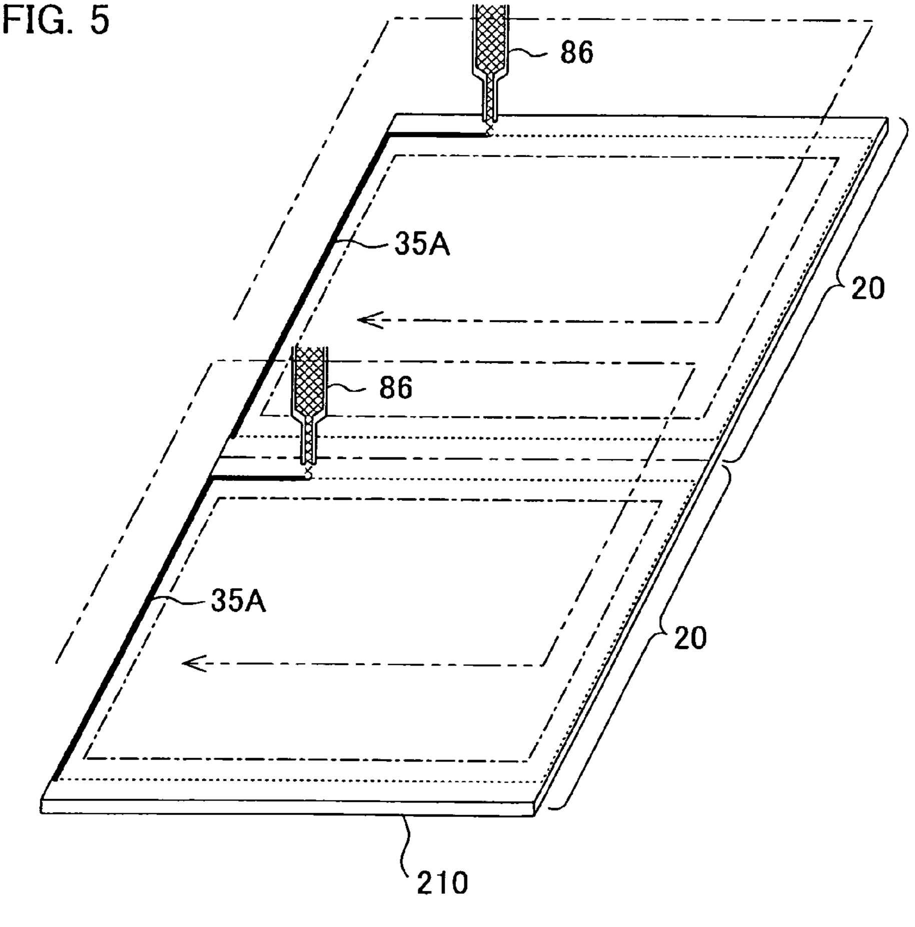
FIG. 5 illustrates an example of a method for applying sealing paste.

FIG. 5 illustrates an example of a method for applying sealing paste. In a manufacturing process of the plasma display panel 1, the front substrate 10 and the rear substrate 20 are made individually. Then, the low melting point glass paste for sealing (hereinafter referred to as seal paste) that includes bead spacers may be applied onto each or both of the front substrate 10 and the rear substrate 20. In the example shown in FIG. 5, a dispenser may be used for applying seal paste 35A onto two rear substrates 20 that are manufactured at a time on a mother glass 210 that may be a material of the glass substrate. The seal paste 35A may be applied by moving two nozzles 86 simultaneously with respect to the rear substrate 20 so that each of them moves along a rectangular track. For example, the nozzles 86 having inner diameter of 4 millimeters are used, and the seal paste 35A having viscosity within the range of 40-50 Pa·s may be applied at movement speed of 100 mm/s and under discharge pressure of 3.0 kgf/cm$^2$, so as to obtain a paste layer having a width within the range of 3-5 millimeters and a thickness within the range of 450-550 microns.

After the seal paste 35A is applied, it may be dried and burned temporarily. After that, the mother glass 210 may be divided into two rear substrates 20. Then, one rear substrate 20 and one front substrate 10 are overlapped with registration and are fixed temporarily using clips at plural portions of the rim, which are carried into a furnace. Then, the inner space defined by the front substrate 10, the rear substrate 20 and the rectangular seal paste layer may be vacuumed through an air hole that may be formed in the rear substrate 20 and a tip tube communicating with the air hole. Thus, the seal paste layer is burned while a pressure in the inner space is reduced. The burning temperature may be set to a temperature close to a softening point of the glass frit.

In the burning process, the front substrate 10 and the rear substrate 20 are attracted to each other due to the decreasing pressure inside. In the area of the screen the front substrate 10 contacts the upper surface of the partitions of the rear substrate 20, while in the area of the sealing portion the distance between the front substrate 10 and the rear substrate 20 decreases as the sealing material is softened. As a result, the width of the seal paste layer is enlarged along the surface of the substrate from approximately 3-5 millimeters to approximately 8-12 millimeters. On this occasion, the bead spacers contained in the seal paste layer prevent the subsidence, i.e., they prevent the gap between the front substrate 10 and the rear substrate 20 from becoming smaller than the height of the partition 29.

When the temperature inside the furnace may be decreased so that the sealing material is hardened, the front substrate 10 and the rear substrate 20 are sealed completely. After that, the discharge gas may be filled in the space, and the tip tube is melted so that the discharge gas space 30 is sealed completely.

Hereinafter, composition of the sealing material 35 will be explained in more detail.

As the bead spacers 71, 72, 73, . . . , glass beads are selected, which contain $Na_2O$, CaO and $SiO_2$ as major components and have a center grain size of 135 microns (made by Nippon Electric Glass Co., Ltd., product number GS/135LR, softening point 730° C.). The grain size of 135 microns is equal to the design value d of the thickness of the sealing material 35 in this embodiment. These glass beads may satisfy the following conditions (1), (2) and (3):

(1) The softening point of them is higher than that of the glass frit (the sealing material) of the major component of the low melting point glass paste. Therefore the shape of them is maintained when the sealing material is burned.

(2) Thermal expansion coefficient of them is close to that of the sealing material.

(3) Increase of viscosity of the seal paste is very little.

As the condition (2) is satisfied, generation of crack due to the thermal stress can be prevented as much as possible. The thermal expansion coefficient of the above-mentioned glass beads is $80\times10^{-7}$/° C., which is close to the thermal expansion coefficient $74\times10^{-7}$/° C. of the sealing material that is used in this example.

The condition (3) is important for obtaining a good sealing structure of the plasma display panel without reducing productivity. If the increase of the viscosity due to addition of the glass beads is little, the seal paste can be applied in the same manner as the case without glass beads so that workability in applying the seal paste is not impaired. In addition, a sufficient quantity of glass beads for obtaining sufficient mechanical strength can be added into the seal paste. Furthermore, if the increase of the viscosity is little, it is not necessary to remove particles having sizes smaller than the desired value so as to suppress the increase of the viscosity. Namely, tolerance of the distribution of granularity of the glass beads can be enlarged, so that a cost necessary for the classification can be eliminated.

Figure 6:
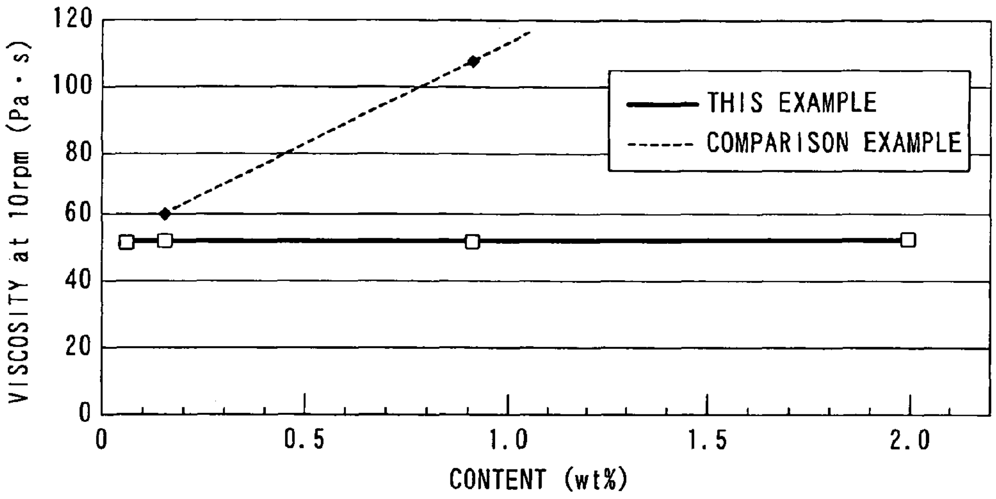
FIG. 6 is a graph showing the relationship between content of bead spacers and viscosity of seal paste.

FIG. 6 is a graph showing the relationship between content of bead spacers and viscosity of seal paste. As viscosity measuring means a rotating viscometer was used, and its rotation speed was 10 rpm.

The glass beads that are added into the low melting point glass paste as the bead spacers have relatively broad distribution of granularity including grain sizes of approximately 5/6 times the above-mentioned design value d and approximately 1.5 times the same, and despite that the viscosity of the seal paste is scarcely altered within the range of content 0.05-2.0 wt % as shown by the thick solid line in FIG. 6.

On the contrary, when glass beads of a comparison example are added into the low melting point glass paste, the viscosity increases along with increase of the content as shown by the broken line in FIG. 6.

The low melting point glass paste that was used includes glass frit having a softening point of 410° C. (made by Nippon Electric Glass Co., Ltd.) dispersed in a vehicle that is a solvent in which a binder such as ethyl cellulose or acrylic is dissolved at a ratio of approximately 5 wt %. The content (wt %) of bead spacers in an exemplary embodiment is expressed as a weight ratio to the glass frit.

Figure 7:
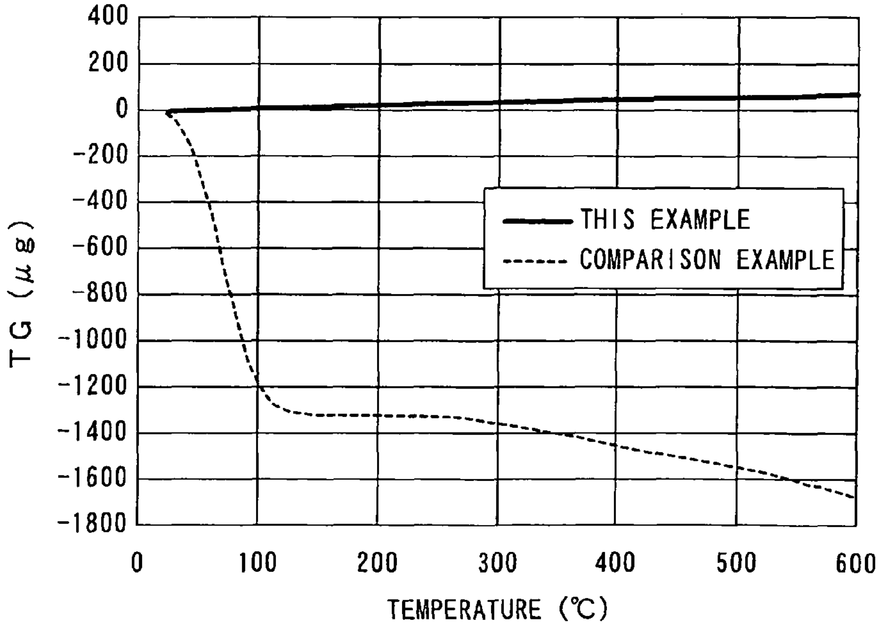
FIG. 7 is a graph showing a result of a differential thermal analysis of the glass beads.

FIG. 7 is a graph showing a result of a differential thermal analysis of the glass beads.

Using a differential thermal analysis device, thermogravimetric change of the glass beads was measured. As shown by the thick solid line in FIG. 7, there was no outstanding change of thermogravimetric value of the glass beads according to this example. In contrast, thermogravimetric value of the glass beads according to the comparison example showed substantial decrease at temperature around 100° C. as shown by the broken line in FIG. 7. This substantial decrease is considered to be caused by evaporation of moisture adsorbed on the surface of the glass beads. In addition, there is also decrease of thermogravimetric value at temperature above 300° C., which is considered to be caused by degassing. As shown in FIG. 7 as results, the glass beads according to the comparison example are porous, while the glass beads according to this example are non-porous.

Figure 8:
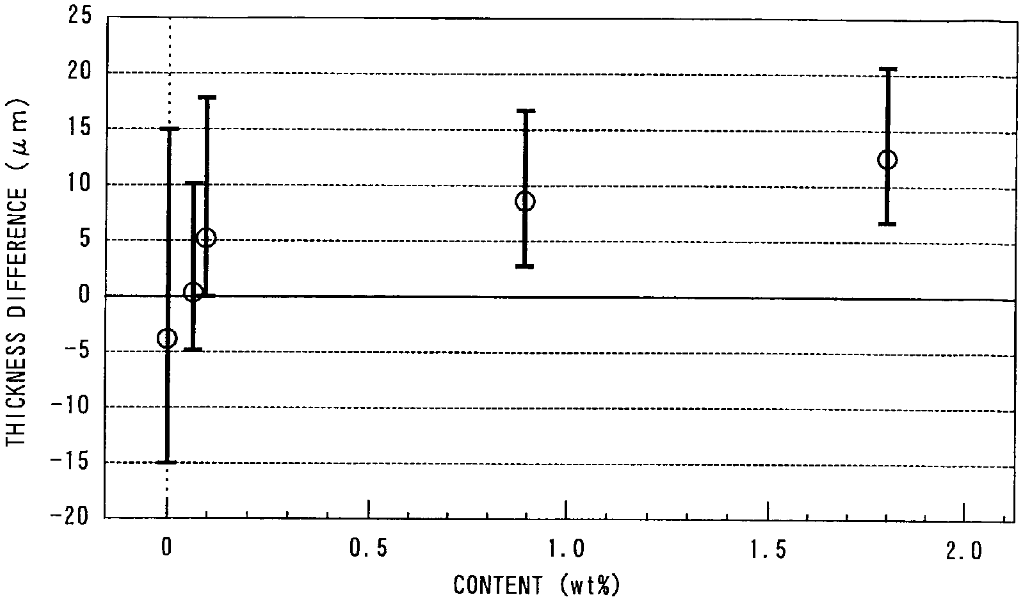
FIG. 8 is a graph showing an effect of bead spacers.
Figure 9:
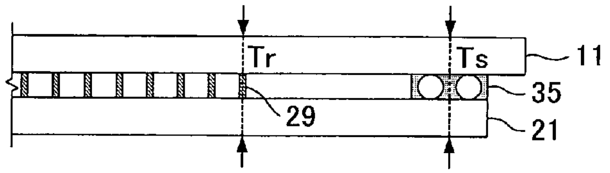
FIG. 9 illustrates positions of measuring thickness values.
Figure 10:
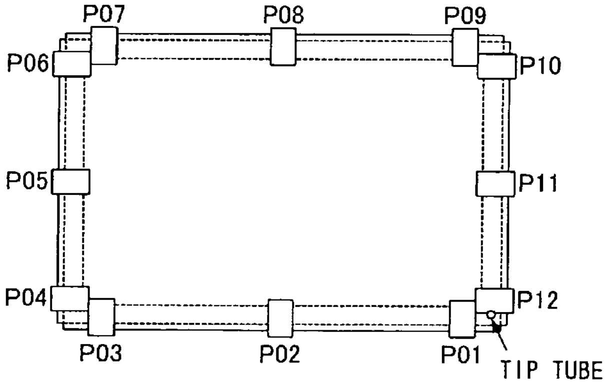
FIG. 10 illustrates positions of measuring thickness values along the perimeter of the plasma display panel.

FIG. 8 is a graph showing an effect of bead spacers. FIG. 8 illustrates differences (=Ts−Tr) between thickness Tr and thickness Ts shown in FIG. 9 at different content values of bead spacers in the sealing material in plural plasma display panels. The thickness Tr means a thickness of the plasma display panel at the position where an outermost partition 29 is disposed, while the thickness Ts is a thickness of the plasma display panel at the position where the sealing material 35 is disposed. The thickness Tr and the thickness Ts were measured for each plasma display panel at twelve positions P01-P12 as shown in FIG. 10, and variations of the measured values are shown by vertical bars in FIG. 8. Each of circles on the bars in FIG. 8 indicates the average value of the twelve measured values.

As shown in FIG. 8, in the case where the content of the bead spacers is zero the measured value of the difference between the thickness Tr and the thickness TS (hereinafter referred to as a thickness difference) varies substantially from −15 to 15 including negative values. A negative value of the thickness difference means that the glass substrate 11 and the glass substrate 21 are abnormally close to each other at the sealing portion. Namely, there is generated a subsidence that makes the glass substrate 11 convex toward the front, which may cause malcontact between the glass substrate 11 and the partition 29. The malcontact may cause generation of a noise.

On the contrary, in the case where the content of the bead spacers is 0.1 wt %, 0.9 wt % or 1.8 wt %, the thickness difference has positive values with small variation. However, the variation in the case where the content is 0.1 wt % is a little larger than that in the case where the content is 0.9 wt % or 1.8 wt %. In the case where the content of the bead spacers is 0.06 wt %, an average value of the thickness differences has a positive value although the thickness differences have a variation from −5 to 10. Therefore, the subsidence can be reduced by adding the bead spacers also in the case where the content is 0.06 wt %.

There is a tendency that the thickness difference increases along with increase of the content. The reason of this is considered to be a large number of particles having a grain size larger than the design value d of the glass beads. If classification is performed more precisely, this tendency can be decreased.

It may be desirable that the content is larger in order to prevent mechanical breakdown of the bead spacers. However, considering bonding power of the sealing material 35 or increase of cost due to addition of the bead spacers, content of 0.05-1.5 wt % is preferable, and 1.0 wt % is more preferable. In the case of 1.0 wt %, 15 bead spacers are contained per 3.6 $mm^2$ of the sealing material 35 by calculation. In this case, the sealing material 35 has strength as being not broken down even by the pressure of 0.70 $kgf/cm^2$ that is applied to the front substrate 10 or the rear substrate 20 so as to compress the sealing material 35.

In the above-explained exemplary embodiment, the pattern of the partition 29 is not limited to the stripe pattern, but it can be a mesh pattern.

The present invention may be applied to a display device having a structural member for defining a gap between a pair of substrates that are sealed at an outer position away from the structural member, and it can contribute to improvement of reliability of the sealing structure.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A method for manufacturing a plasma display panel including a front substrate and a rear substrate that are opposed to each other with a discharge gas space therebetween, and a structural member for defining a thickness of the discharge gas space in a screen area, the method comprising:

making the front substrate and the rear substrate individually;

applying a low melting point glass paste including non-porous bead spacers at a ratio within a range of 0.05-2.0 wt % to glass frit onto a peripheral portion of the front substrate or the rear substrate so that the applied low melting point glass paste forms a frame-like shape having a height greater than that of the structural member;

assembling the front substrate and the rear substrate in a face-to-face relation with each other; and burning the applied low melting point glass paste while vacuuming a discharge gas space between the front substrate and the rear substrate so as to seal the front substrate and the rear substrate at their peripheral portions.

2. The method according to claim 1, the low melting point glass paste being applied so that the applied low melting point glass paste forms a frame-like shape having a height greater than that of the structural member and a width within a range of 3-5 mm.

3. A method for manufacturing a plasma display panel including a front substrate and a rear substrate that are opposed to each other with a discharge gas space therebetween, and sealed at their peripheral portions with a sealing material, the method comprising:

preparing the front substrate and the rear substrate;

discharging a low melting point glass paste as a sealing material from a nozzle of a dispenser to apply the low melting point glass paste onto a peripheral portion of the front substrate or the rear substrate so that the applied low melting point glass paste forms a frame-like shape;

assembling the front substrate and the rear substrate in face-to-face relation with each other with the applied low melting point glass paste therebetween; and burning the applied low melting point glass paste to seal the front substrate and the rear substrate at their peripheral portions, the low melting point glass paste being applied from the nozzle includes 0.05-2.0 wt % of non-porous glass bead spacers to glass frit and has a viscosity of not more than 50 Pa·s.

4. The method according to claim 3, wherein the frame-like shape has a width of 3-5 mm and a pressure in a space between the front substrate and the rear substrate is reduced after the assembling and before the burning so that the width is enlarged to be within a range of 8-12 mm.

5. The method according to claim 3, wherein the viscosity is within a range of 40-50 Pa·s.

6. The method according to claim 3, wherein one kind of glass bead that shows a smallest change of a thermogravimetric value, measured by the differential thermal analysis, among a plurality of kinds of glass beads is selected as the non-porous glass bead spacers.

7. A method for manufacturing a plasma display panel including a front substrate and a rear substrate that are opposed to each other with a discharge gas space therebetween, and sealed at their peripheral portions with a sealing material, the method comprising:

preparing the front substrate;

preparing a mother glass having a plurality of areas each identical in both a shape and a size with the rear substrate, elements to be formed on the rear substrate being formed in each of the areas;

discharging a low melting point glass paste as a sealing material from a plurality of nozzles of a dispenser, each nozzle facing each of the areas, to apply the low melting point glass paste onto a peripheral portion of each of the plurality of areas at a same time so that the applied low melting point glass paste forms a frame-like shape, the applied low melting point glass paste including 0.05-2.0 wt % of non-porous glass bead spacers to glass frit and having a viscosity within a range of 40-50 Pa·s;

temporarily burning the applied low melting point glass paste on the mother glass;

cutting off the plurality of areas from the mother glass to obtain a plurality of rear substrates;

assembling the prepared front substrate and one of the plurality of rear substrates thus obtained in face-to-face relation with each other with the temporarily burned low melting point glass paste therebetween; and burning the temporarily burned low melting point glass paste to seal the front substrate and the rear substrate at their peripheral portions.

* * * * *

UNITED STATES PATENT AND TRADEMARK OFFICE

CERTIFICATE OF CORRECTION

PATENT NO. : 7,850,503 B2
APPLICATION NO. : 12/222520
DATED : December 14, 2010
INVENTOR(S) : Minahiro Nonomura et al.

It is certified that error appears in the above-identified patent and that said Letters Patent is hereby corrected as shown below:

In the Specifications:
Column 1, Line 11 delete "Jun. 20, 2004" and insert -- Jun. 30, 2004 --, therefor.

Signed and Sealed this
First Day of March, 2011

David J. Kappos
*Director of the United States Patent and Trademark Office*